United States Patent [19]

Tateno

[11] Patent Number: 4,996,443

[45] Date of Patent: Feb. 26, 1991

[54] INTEGRATED CIRCUIT FOR LEVEL SHIFT

[75] Inventor: Tetsuya Tateno, Kanagawa, Japan

[73] Assignee: Canon Kabushiki Kaisha, Tokyo, Japan

[21] Appl. No.: 317,813

[22] Filed: Mar. 1, 1989

[30] Foreign Application Priority Data

Mar. 7, 1988 [JP] Japan .................. 63-051545

[51] Int. Cl.$^5$ ............ H03K 17/10; H03K 17/16; H03K 17/687; H03K 3/356
[52] U.S. Cl. ................ 307/264; 307/475; 307/279; 307/290; 307/585; 307/576; 307/579; 307/451; 365/226; 365/228
[58] Field of Search ........... 307/264, 290, 475, 585, 307/279, 576, 280, 579, 451, 291, 270; 365/226, 228, 205, 10 A

[56] References Cited

U.S. PATENT DOCUMENTS

| | | | |
|---|---|---|---|
| 4,409,677 | 10/1983 | Takemae et al. | 307/475 |
| 4,656,374 | 4/1987 | Rapp | 307/475 |
| 4,663,701 | 5/1987 | Stotts | 307/264 X |
| 4,695,744 | 9/1987 | Giordano | 307/279 |
| 4,801,819 | 1/1989 | Theus et al. | 307/279 X |
| 4,845,381 | 7/1989 | Cuevas | 307/264 |
| 4,871,933 | 10/1989 | Galbraith | 307/279 X |
| 4,871,978 | 10/1989 | Galbraith | 307/530 X |

Primary Examiner—Stanely D. Miller
Assistant Examiner—David R. Bertelson
Attorney, Agent, or Firm—Robin, Blecker, Daley & Driscoll

[57] ABSTRACT

An integrated circuit for level shift is a parallel-connected circuit comprised of a first circuit including a first MOS FET of one conductive type, a third MOS FET of another conductive type and a first MOS FET of the other conductive type which are series-connected in this order and a second circuit including a second MOS FET of the one conductive type, a fourth MOS FET of the other conductive type and a second MOS FET of the other conductive type which are series-connected in this order, wherein gates of the first and second MOS FETs of the one conductive type are connected respectively to the output side and input side of an inverter connected to a low voltage electric power source, gates of the third and fourth MOS FETs of the other conductive type both are connected to a reference voltage source, a gate of the first MOS FET of the other conductive type is connected to a common junction point of the fourth MOS FET and the second MOS FET of the other conductive type, a gate of the second MOS FET of the other conductive type is connected to a common junction point of the third MOS FET and the first MOS FET of the other conductive type, and the parallel-connected circuit is connected to a high voltage electric power source.

10 Claims, 2 Drawing Sheets

INTEGRATED CIRCUIT FOR LEVEL SHIFT

BACKGROUND OF THE INVENTION

1. Field of the Invention:

This invention relates to an integrated circuit for level-shifting a small logical amplitude to a large logical amplitude.

2. Description of the Related Art:

FIG. 1 is an electric circuit diagram of a conventional example. This circuit shifts the level from a small logical amplitude $V_{DD}-V_{SS1}$ to a large logical amplitude $V_{DD}-V_{SS2}$. In FIG. 1, P1 represents a first P type MOS FET (hereinafter abbreviated as P1) and N1 represents a first N type MOS FET (hereinafter abbreviated as N1). The P1 and N1 are connected at their drains to each other and to a high voltage electric power source (in between $V_{DD}$ and $V_{SS2}$).

Also, a second P type MOS FET (hereinafter abbreviated as P2) and a second N type MOS FET (hereinafter abbreviated as N2) are connected at their drains to each other and to the high voltage electric power source (in between $V_{DD}$ and $V_{SS2}$).

INV1 is an inverter connected to a low voltage electric power source (in between $V_{DD}$ and $V_{SS1}$) and to which an input of the small logical amplitude $V_{DD}-V_{SS1}$ is applied. The gates of the P1 and P2 are connected respectively to the output and input terminals of the inverter INV1.

Also, the gate of the N1 is connected to the common junction point of the P2 and N2, and the gate of the N2 is connected to the common junction point of the P1 and N1.

Next, the operation of this circuit is explained.

First assuming that the input of the inverter INV1 is high, that is, at $V_{DD}$ level, then the P1 turns on because its gate is low, that is, at $V_{SS1}$ level, the P2 turns off because its gate is at $V_{DD}$ level, the drains of the P1 and N1 are at $V_{DD}$ level, and the drains of the P2 and N2 are at $V_{SS2}$ level.

Then, when the input of the inverter INV1 becomes low, that is, at $V_{SS1}$ level, the P1 turns off and the P2 turns on, causing the drains of the P2 and N2 to take an equilibrium level by their ON resistances. Therefore, the N1 turns on to discharge the charge on the gate of the N2. Thus, the N2 turns off.

In such a manner, the small logical amplitude $V_{DD}-V_{SS1}$ at the input of the inverter INV1 is converted into the large logical amplitude $V_{DD}-V_{SS2}$ at the drain of the P1 or P2.

In the above-described conventional example, the gates of the P1 and P2 are biased only at the small logical amplitude $V_{DD}-V_{SS1}$, while the gates of the N1 and N2 are biased at the large logical amplitude $V_{DD}-V_{SS2}$. To allow for flow of the same current, the Gm (current mu-factor) ratio between the P1 or P2 and the N1 or N2 must be given a large value. This leads to the necessity of increasing the size of the P1 and P2. As a result, the integrated circuit has a problem that its dimensions become objectionably bulky.

Meanwhile, in order to take this ratio at a smaller value, another circuit may be considered as shown in FIG. 2, wherein as the resistance components for the sources of the N1 and N2, use is made of third and fourth N type MOS FET N3 and N4 respectively to the gates of which a reference voltage Vref is applied. However, even this circuit has the gates of the N1 and N2 biased by a large logical level. Therefore, a considerably large ratio is required between the P1 or P2 and the N1 or N2.

SUMMARY OF THE INVENTION

With the foregoing in mind, the invention has been made and its object is to provide an integrated circuit for level shift which enables the ratio between a MOS FET of one conductive type, for example, the P1 or P2 and a MOS FET of another conductive type, for example, the N1 or N2 to be reduced with an advantage of increasing the degree of integration.

To achieve the above-described object, in an embodiment of the invention, the integrated circuit for level shift comprises a first series-connected circuit including a first MOS FET of one conductive type, a third MOS FET of another conductive type and a first MOS FET of the other conductive type which are connected in series in this order, and a second series-connected circuit including a second MOS FET of the one conductive type, a fourth MOS FET of the the other conductive type and a second MOS FET of the other conductive type which are connected in series in this order, the first series-connected circuit and the second series-connected circuit being connected in parallel to each other to constitute a parallel-connected unit. A gate of the first MOS FET of the one conductive type and a gate of the second MOS FET of the one conductive type are connected respectively to the output side and the input side of an inverter connected to a low voltage electric power source. A gate of the third MOS FET of the other conductive type and a gate of the fourth MOS FET of the other conductive type both are connected to a reference voltage source. A gate of the first MOS FET of the other conductive type is connected to a common junction point of the fourth MOS FET of the other conductive type and the second MOS FET of the other conductive type. A gate of the second MOS FET of the other conductive type is connected to a common junction point of the third MOS FET of the other conductive type and the first MOS FET of the other conductive type. A high voltage electric power source is connected to the parallel-connected unit. In such a way, the integrated circuit for level shift is constructed.

By the above-described feature, the gates of the first and second MOS FETs of the other conductive type are biased by as much a small level of amplitude as (reference voltage - threshold voltage) - $V_{SS2}$.

DETAILED DESCRIPTION OF THE PREFERRED EMBODIMENTS

The invention is next described in connection with an embodiment thereof.

Figure 1:
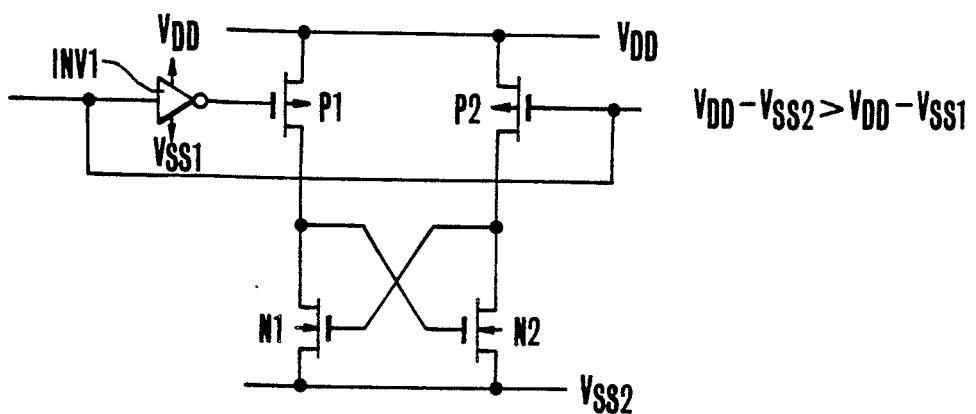
FIG. 1 is an electric circuit diagram of a first conventional example.
Figure 2:
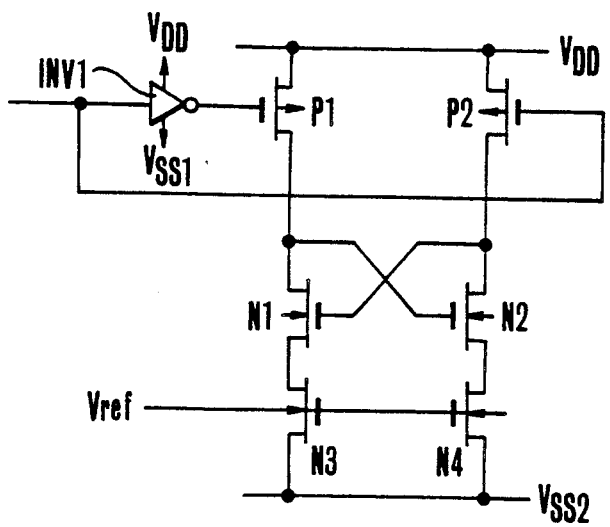
FIG. 2 is an electric circuit diagram of a second conventional example.
Figure 3:
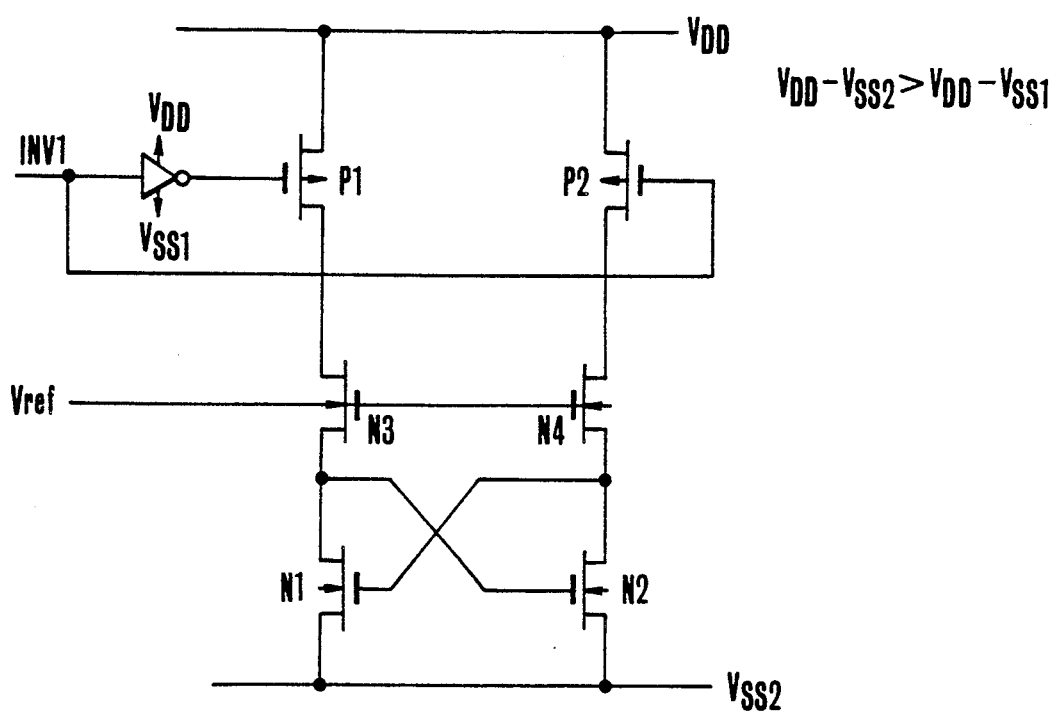
FIG. 3 is an electric circuit diagram of an embodiment of the invention.

FIG. 3 shows one embodiment of an integrated circuit for level shift according to the invention. As shown in FIG. 3, third and fourth N type MOS FETs N3 and N4 to the gates of which a reference voltage Vref is applied are provided on the drain side of the N1 and N2.

That is, the drain of the P1 and the drain of the N3 are connected to each other, and the source of the N3 and the drain of the N1 are connected to each other, thus constituting a series-connected circuit, which is connected to a high voltage electric power source (in between $V_{DD}$ and $V_{SS2}$). Also, the drain of the P2 and the drain of the N4 are connected to each other, and the source of the N4 and the drain of the N2 are connected to each other, thus constituting a series-connected circuit, which is also connected to the high voltage electric power source (in between $V_{DD}$ and $V_{SS2}$).

Further, the gate of the P1 and the gate of the P2 are connected respectively to the output side and the input side of an inverter INV1 connected to a low voltage electric power source (in between $V_{DD}$ and $V_{SS1}$). The gates of the N3 and N4 both are connected to a reference electric power source having a positive constant value of the reference voltage Vref with respect to the voltage $V_{SS2}$. Further, the gate of the N1 is connected to a common junction point of the N4 and N2, and the gate of the N2 is connected to a common junction point of the N3 and N1.

This circuit operates as follows:

First, the input of the inverter INV1 is assumed to be low, that is, at $V_{SS1}$ level. Then, the P1, because of its gate being at $V_{DD}$ level, is off, and the P2, because of its gate being at $V_{SS1}$ level, is on. The drains of the P1 and N3 are at VSS2 level. The drains of the P2 and N4 are at $V_{DD}$. The drain of the N1 and the gate of the N2 are at $V_{SS2}$ level. The drain of the N2 and the gate of the N1 are at (reference voltage Vref-threshold voltage Vth) level.

In this state, when the input of the inverter INV1 changes from low level to high level, that is, from the $V_{SS1}$ level to the $V_{DD}$ level, the P1 turns on, and the P2 turns off. Then, the voltage at the drain of the N1 and the gate of the N2 is rising, while the voltage at the drain of the N2 is lowering toward the $V_{SS2}$ level. Therefore, the drain voltage of the N1 further rises, reaching a value of (Vref-Vth), at which the N3 turns off. After that, the drain voltage of the N1 no longer rises any more than that value. Meanwhile, the drain voltage of the N3 can rise to the $V_{DD}$ level since the P1 is on.

In such a manner, while limiting the amplitude of the bias of the gates of the N1 and N2, the small logical amplitude $V_{DD}-V_{SS1}$ at the input of the inverter INV1 can be converted into the large logical amplitude $V_{DD}-V_{SS2}$ at the drain of the P1 or P2.

Hence, the ratio between the P1 or P2 and the N1 or N2 can be made smaller, thus making it possible to increase the degree of integration of the integrated circuit.

In the embodiment described above, each of the MOS FETs may be replaced by that of the opposite conductive type, and the polarity of each of the electric power sources may be inverted. Even in this case, an integrated circuit for level shift of a similar function having as great advantages can be obtained.

As has been described above, according to the invention, the difference between the amplitude of the bias voltage of the first and second MOS FETs of one conductive type and the amplitude of the bias voltage of the first and second MOS FETs of another conductive type can be reduced. In turn, the ratio between the first and second MOS FETs of the one conductive type and the first and second MOS FETs of the other conductive type can be minimized, giving rise to an advantage of improving the degree of integration of the integrated circuit.

What is claimed is:

1. An integrated circuit for level shift, comprising a first series-connected circuit including a first MOS FET (P1) of one conductive type, a third MOS FET (N3) of another conductive type and a first MOS FET (N1) of the other conductive type which are connected in series in this order, and a second series-connected circuit including a second MOS FET (P2) of the one conductive type, a fourth MOS FET (N4) of the the other conductive type and a second MOS FET (N2) of the other conductive type which are connected in series in this order, said first series-connected circuit and said second series-connected circuit being connected in parallel to each other to constitute a parallel-connected unit, a gate of said first MOS FET of the one conductive type and a gate of said second MOS FET of the one conductive type being connected respectively to the output side and the input side of an inverter (INV1) connected to a low voltage electric power source, a gate of said third MOS FET of the other conductive type and a gate of said fourth MOS FET of the other conductive type both being connected to a reference voltage source (Vref), a gate of said first MOS FET of the other conductive type being connected to a common junction point of said fourth MOS FET of the other conductive type and said second MOS FET of the other conductive type, a gate of said second MOS FET of the other conductive type being connected to a common junction point of said third MOS FET of the other conductive type and said first MOS FET of the other conductive type, said parallel-connected unit being for connection to a high voltage electric power source ($V_{DD}$).

2. A circuit according to claim 1, wherein said one conductive type is P type, and wherein said other conductive type is N type.

3. A level shift circuit comprising:
 (a) first to third transistors (P1, N3, N1) which are connected in series to constitute a first circuit;
 (b) fourth to sixth transistors (P2, N4, N2) which are connected in series to constitute a second circuit, said first circuit and said second circuit being connected in parallel relative to a predetermined voltage $V_{DD}-V_{SS2}$);
 (c) first input means (INV1) for selectively causing one of said first and said fourth transistors to operate with a voltage lower than said predetermined voltage;
 (d) second input means (Vref) for inputting a common signal to said second and said fifth transistors; and
 (e) connecting means for connecting control electrodes of said third and said sixth transistors respectively to other electrodes of said sixth and said third transistors.

4. A circuit according to claim 3, wherein said first and said fourth transistors are of the same conductive type.

5. A circuit according to claim 4, wherein said second, said third, said fifth and said sixth transistors are of the conductive type different from that of said first and said fourth transistors.

6. A circuit according to claim 3, wherein said first input means includes an inverter.

7. A circuit according to claim 3, wherein said second input means is a constant voltage.

8. A circuit according to claim 3, wherein said first to said sixth transistors are MOS FETs.

9. A circuit according to claim 4, wherein said first and said fourth transistors have a P type channel.

10. A circuit according to claim 5, wherein said second, said third, said fifth and said sixth transistors have an N type channel.

* * * * *